(12) United States Patent
Rabinovich et al.

(10) Patent No.: US 7,564,415 B2
(45) Date of Patent: Jul. 21, 2009

(54) ANTENNA SYSTEM FOR REMOTE CONTROL AUTOMOTIVE APPLICATION

(75) Inventors: Victor Rabinovich, Richmond Hill (CA); Steven Steane, Courtice (CA)

(73) Assignee: Flextronics Automotive Inc., Ontario (CA)

( * ) Notice: Subject to any disclaimer, the term of this patent is extended or adjusted under 35 U.S.C. 154(b) by 23 days.

(21) Appl. No.: 11/819,768

(22) Filed: Jun. 29, 2007

(65) Prior Publication Data
US 2008/0020723 A1 Jan. 24, 2008

Related U.S. Application Data

(63) Continuation-in-part of application No. 11/150,051, filed on Jun. 10, 2005, now abandoned.

(60) Provisional application No. 60/647,885, filed on Jan. 28, 2005.

(51) Int. Cl.
*H01Q 1/32* (2006.01)
*H01Q 1/00* (2006.01)

(52) U.S. Cl. .................................. 343/713; 343/905

(58) Field of Classification Search ........... 343/711, 343/713, 895, 905, 700 MS, 702, 833, 846, 343/850
See application file for complete search history.

(56) References Cited

U.S. PATENT DOCUMENTS

| | | | |
|---|---|---|---|
| 5,768,771 A | 6/1998 | O'Sullivan et al. | |
| 6,078,293 A * | 6/2000 | Yamamoto | 343/713 |
| 6,731,020 B2 | 5/2004 | Burr et al. | |
| 6,842,149 B2 | 1/2005 | Taubman | |
| 6,977,615 B2 * | 12/2005 | Brandwein, Jr. | 343/700 MS |
| 7,050,011 B2 * | 5/2006 | Ghabra et al. | 343/711 |
| 7,135,827 B1 * | 11/2006 | Lampson | 318/135 |
| 2005/0046978 A1 * | 3/2005 | Schofield et al. | 359/876 |
| 2006/0170610 A1 | 8/2006 | Ravinovich | |

* cited by examiner

*Primary Examiner*—Shih-Chao Chen
(74) *Attorney, Agent, or Firm*—Patton Boggs LLP

(57) ABSTRACT

An antenna system for remote control applications including a communications module, a printed circuit board including an antenna assembly disposed thereon, and a radio frequency cable having a first connection end and a second connection end. The first connection end may be coupled to the communications module and the second connection end may be coupled to the printed circuit board. The second connection end includes a center conductor for communicating signals and a coaxial shield encircling the center conductor. A portion of the center conductor may extend from the coaxial shield and have a substantially 90 degree bend above a connection point of the printed circuit board and center conductor.

11 Claims, 9 Drawing Sheets

US 7,564,415 B2

ANTENNA SYSTEM FOR REMOTE CONTROL AUTOMOTIVE APPLICATION

CROSS REFERENCE TO RELATED APPLICATION

This application is a Continuation-in-Part of U.S. patent application Ser. No. 11/150,051 filed on Jun. 10, 2005 now abandoned, which claims the benefit of priority from U.S. Provisional Application No. 60/647,885 filed on Jan. 28, 2005, entitled "Antenna System for Remote Control Automotive Application."

BACKGROUND

The present exemplary embodiment relates to a wireless apparatus. It finds particular application in conjunction with remote control operations of an automobile, including remote keyless entry (RKE) automotive communication, and will be described with particular reference thereto. However, it is to be appreciated that the present exemplary embodiment is also amenable to other like applications.

Modem vehicles are operated with more and more optional equipment for providing additional features and achieving more comfort. For example, remote keyless entry (RKE) systems, remote starting devices, and global positioning systems (GPS), etc. have become commonplace amenities. Often, such optional equipment is integrated within an existing steering column assembly in order to facilitate electronic control. A typical existing steering column assembly is described in U.S. Pat. No. 6,731,020 to Burr. In order to integrate optional equipment into the existing steering column assembly however, existing sensor and control circuitry must be modified. As a result of this integration, an increase in cable wiring and wireless components such as antennas is often necessary to provide remote operation of the equipment. This increased wiring and associated equipment makes it difficult to arrange the existing sensor and control electronics within a limited amount of packaging room available in a vehicle.

In an integrated environment, sensor and control electronics must exist in close proximity to antennas and other wireless circuitry. However, as antenna size decreases, antenna gain decreases, making it more difficult to receive signals. Moreover, antennas and their corresponding wireless circuitry are sensitive to noise, especially noise generated in close proximity to the antenna. Devices with internal integrated antennas therefore cannot provide extended communication range because of reduced antenna size and the electromagnetic interference between the antenna and the electronic components of the sensor and control circuits.

One option to reduce electromagnetic interference and improve antenna performance is described in U.S. Pat. No. 5,027,128 to Blaese which describes a dipole antenna configuration. The dipole antenna is mounted within a non-conducting housing such that dipole arms of the antenna extend outside the housing. The housing is then mounted to the vehicle, and an RF cable connects the dipole antenna to a remote keyless entry (RKE) receiver. While this configuration improves performance, the size of the dipole at 315 MHz is so large that it cannot be contained within the interior parts of the vehicle, e.g. within the vehicle integrated front panel. Indeed, the size of the dipole restricts the location of the antenna to the inside window of the vehicle.

Another antenna configuration, which is slightly more compact, is described in U.S. Pat. No. 5,900,841 to Hirata. The vehicle antenna is a thin film antenna that adheres to ornamental plates covering the front, center, and rear pillars of a vehicle chassis. An RF cable connects the vehicle antenna to control circuitry. While the size of the antenna is smaller in this configuration, the system has reduced communication range for some angle direction because of car body shadows. The metal pillars of the vehicle chassis interfere with the antenna radiation pattern, causing reception nulls in some directions surrounding the vehicle. These reception nulls are called car body shadows.

SUMMARY

One embodiment may include an antenna system for remote control applications including a communications module, a printed circuit board including an antenna assembly disposed thereon, and a radio frequency cable having a first connection end and a second connection end. The first connection end may be coupled to the communications module and the second connection end may be coupled to the printed circuit board. The second connection end includes a center conductor for communicating signals and a coaxial shield encircling the center conductor. A portion of the center conductor may extend from the coaxial shield and have a substantially 90 degree bend above a connection point of the printed circuit board and center conductor.

In accordance with one aspect of the present exemplary embodiment, an antenna system for remote control applications comprises a communications module, an antenna assembly, and a radio frequency cable, having a first connection end and a second connection end, wherein the first connection end is coupled to the communications module and the second connection end is coupled to the antenna assembly. The antenna assembly is located a predetermined distance from the communications module, the predetermined distance substantially reducing null regions in an antenna radiation pattern of the antenna system.

In accordance with another aspect of the present exemplary embodiment, an antenna diversity system for remote control applications comprises an antenna assembly, a communications module, an electronic switch assembly, wherein a first RF cable couples the electronic switch assembly to the antenna assembly and a second RF cable couples the electronic switch assembly to the communications module, wherein the antenna assembly, the first RF cable, the second RF cable, the electronic switch assembly and the communications module form a radio frequency circuit; and a diversity RF cable, coupled to the electronic switch assembly, wherein the electronic switch assembly switches the diversity RF cable into and out of the radio frequency circuit.

DETAILED DESCRIPTION

Figure 1:
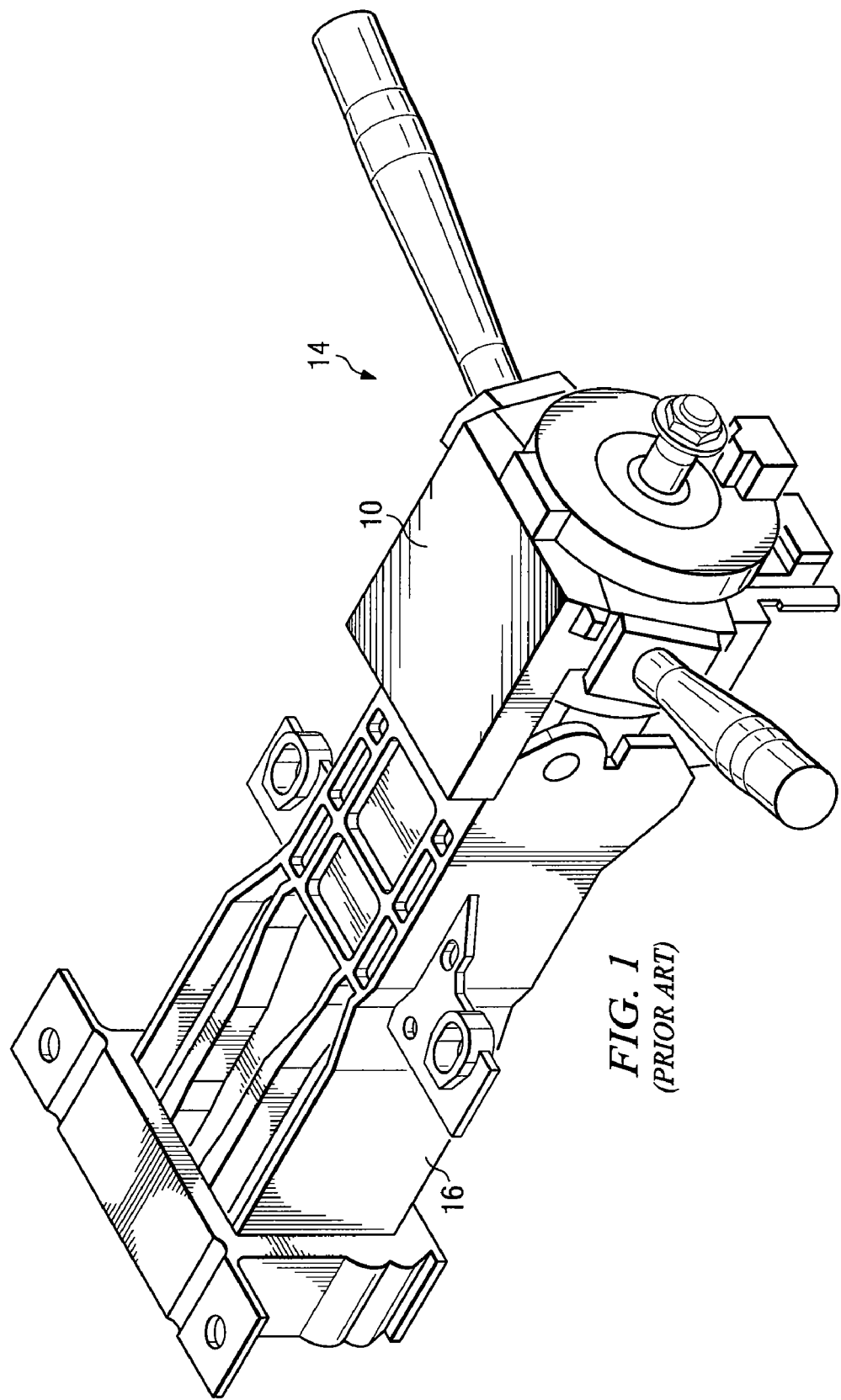
FIG. 1 is a perspective view of a communications module in a vehicle.

With reference to FIG. 1, shown is a vehicle steering assembly such as that described in U.S. Pat. No. 6,731,020 to Burr, which is hereby incorporated by reference in its entirety. Communications module 10 is mounted on top of steering column 14. Communications module 10 is grounded to the vehicle chassis 16.

Figure 2:
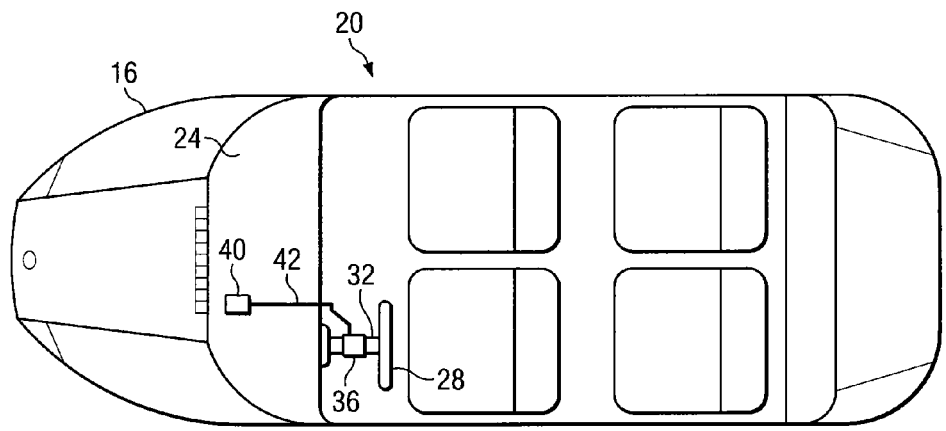
FIG. 2 is a top view of a vehicle using one exemplary embodiment of the present concept.

With reference to FIG. 2, shown is a top view of a typical vehicle implementing one exemplary embodiment of the present concept. Vehicle 20 has a vehicle integrated front panel 24. A steering wheel 28 is mounted on steering column assembly 32. Remote keyless entry (RKE) module 36 is mounted on top of the steering column assembly 32, and is grounded to the vehicle chassis 16. Antenna assembly 40 is separate from the RKE module 36 and is mounted under the vehicle integrated front panel 24. RF cable 42 connects the RKE module 36 to the antenna assembly 40.

The described assembly commonly operates in a 300 MHz to 500 MHz frequency range. It is to be appreciated, however, that the concepts described may be used in other frequency ranges. While the following description centers on a remote keyless entry (RKE) module, other remote control devices may also benefit from the present innovations, both within and outside of the automotive industry.

Figure 3A:
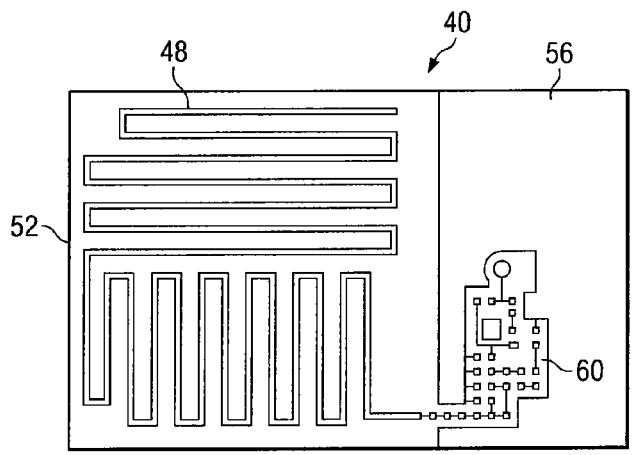
FIG. 3a is a meander line circuit board antenna pattern for use in the exemplary embodiment of FIG. 2.

Turning now to FIG. 3a, a more detailed view of the antenna assembly 40 is shown. Antenna assembly 40 includes a first antenna arm 48, which is deposited on one side of a printed circuit board 52. A second antenna arm 56, i.e. a ground antenna arm, is deposited on the other side of the printed circuit board 52. Optionally, electronic components 60 are placed on the side of the printed circuit board 52 containing the first antenna arm 48, and are grounded to the second antenna arm 56. Electronic components 60 electrically couple both the first antenna arm 48 and the second antenna arm 56 to the RF cable 42.

Printed circuit board 52 is constructed from any dielectric substrate material known in the art and is much smaller than the wavelength of the received signal. First antenna arm 48 may be a monopole, meander line, simple loop, fractal tree, etc. or other antenna structure known in the art. Electronic components 60 may include a matching circuit to match the antenna impedance to a known value, typically 50 ohms output antenna impedance, in order to facilitate connections to other circuitry. Electronic components 60 may optionally contain amplifier circuitry in order to provide extended communication range.

Figure 3B:
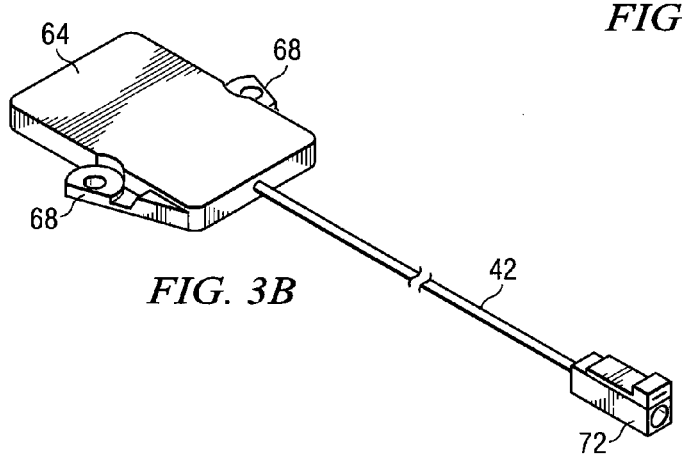
FIG. 3b is the housing for the antenna element of FIG. 2.

With reference to FIG. 3b, shown is a housing for the antenna assembly. Antenna assembly 40 (not shown) is encased in case (of communication module) 64. Case holders 68 allow mounting of the case 64 to the space located under the vehicle integrated front panel 24. RF cable 42 connects the antenna assembly 40 that is encased in case 64 to other electronic components, e.g. the RKE module, through connector 72. The size of the case 64 is approximately 8 cm in length, 6 cm in width, and 0.8 cm in height. Case 64 and case holders 68 are constructed from plastic. In the present when reference is made to antenna assembly 40, the assembly may be encased in case 60.

Referring again to FIGS. 2 and 3a, the antenna assembly 40, RF cable 42, and RKE module 36 together with the vehicle chassis 16 form an antenna resonance system. Specifically, the RF cable 42, RKE module 36, and the vehicle chassis 16 effectively act as part of the second antenna arm 56. Thus, the antenna assembly, which includes the RF cable 42, extends the communication range of the entire system. The antenna resonance system receives radio frequency signals from a remote entry device, e.g. a fob key. The radio frequency signals are sent to the remote keyless entry (RKE) module, where the signals are decoded and further processing occurs.

The first antenna arm 48, shown in FIG. 3a, is an unbalanced antenna type. Unbalanced antennas are affected by the radio frequency current flowing through the electrically connected RF cable and vehicle chassis, such that a significant amount of radiation emanates from the RF cable. Therefore, this direct connection of an unbalanced antenna to an RF cable is not common. However, this connection enhances the antenna performance, particularly the antenna gain. For example, the moment-based electromagnetic simulation software package, IE3D, available from Zeland Software, was used to calculate radiation efficiency. The radiation efficiency of the unbalanced antenna of FIG. 3a alone was 0.15. When an RF cable with a horizontal length of 25 cm was added, as described, to the unbalanced antenna, the radiation efficiency increased to 0.5.

Figure 4:
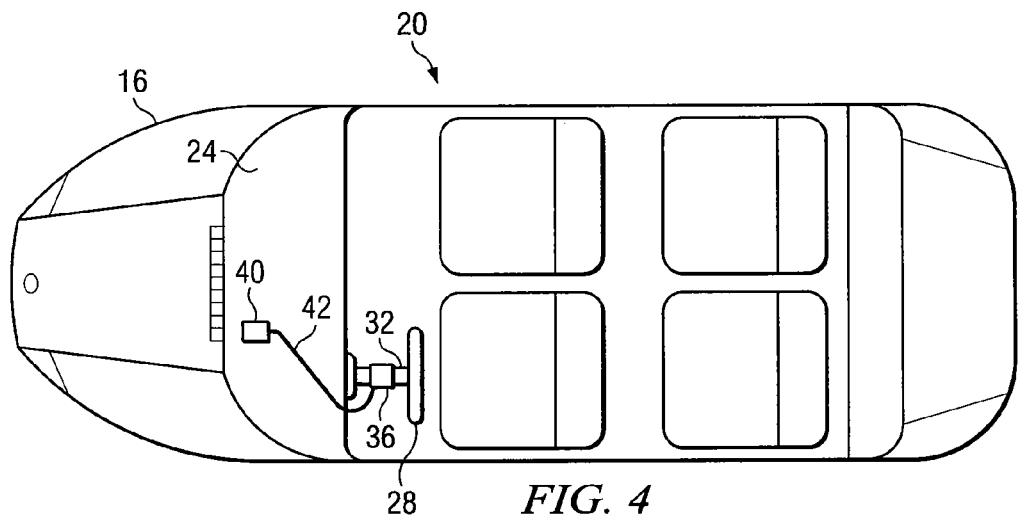
FIG. 4 shows the top view of a vehicle using another exemplary embodiment of the present concept.
Figure 5:
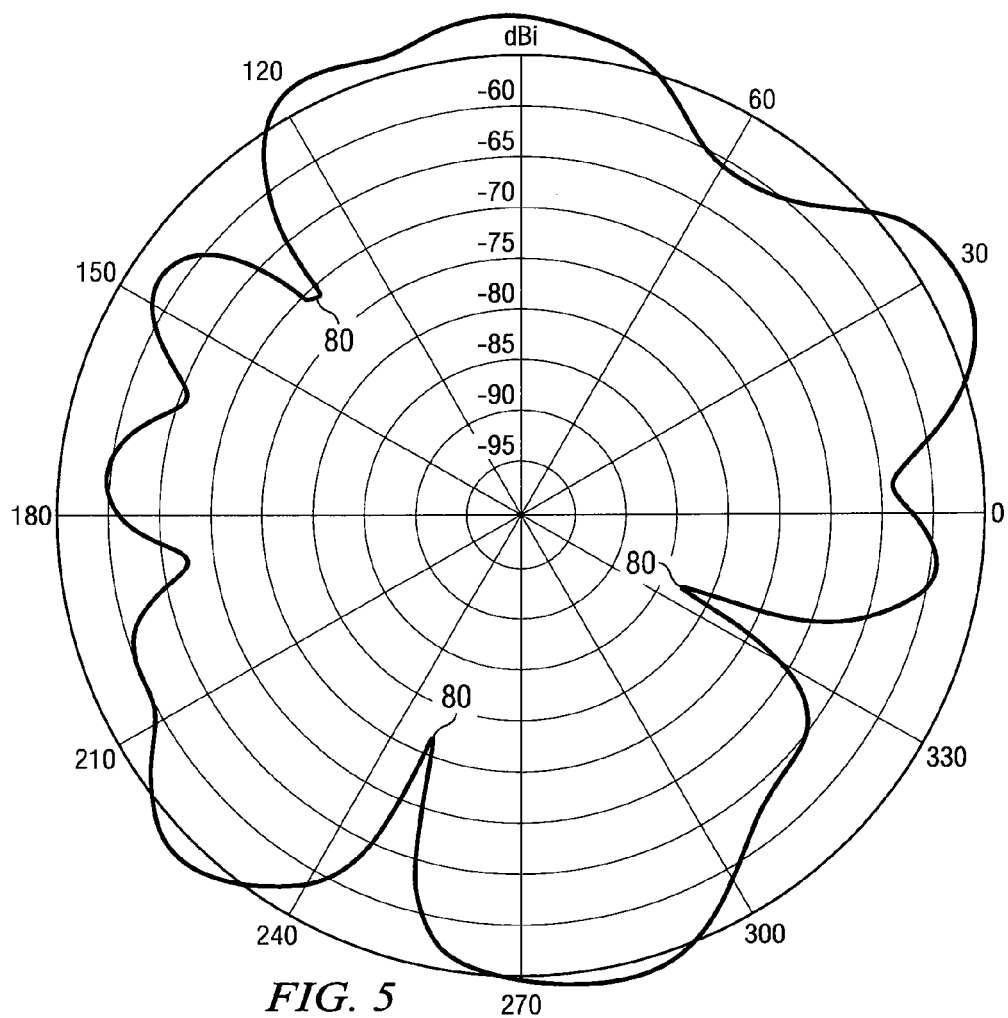
FIG. 5 are experimental results of the horizontal plane radiation pattern of the antenna arrangement of the device shown in FIG. 2 with the transmitter having a horizontally polarized antenna.
Figure 6:
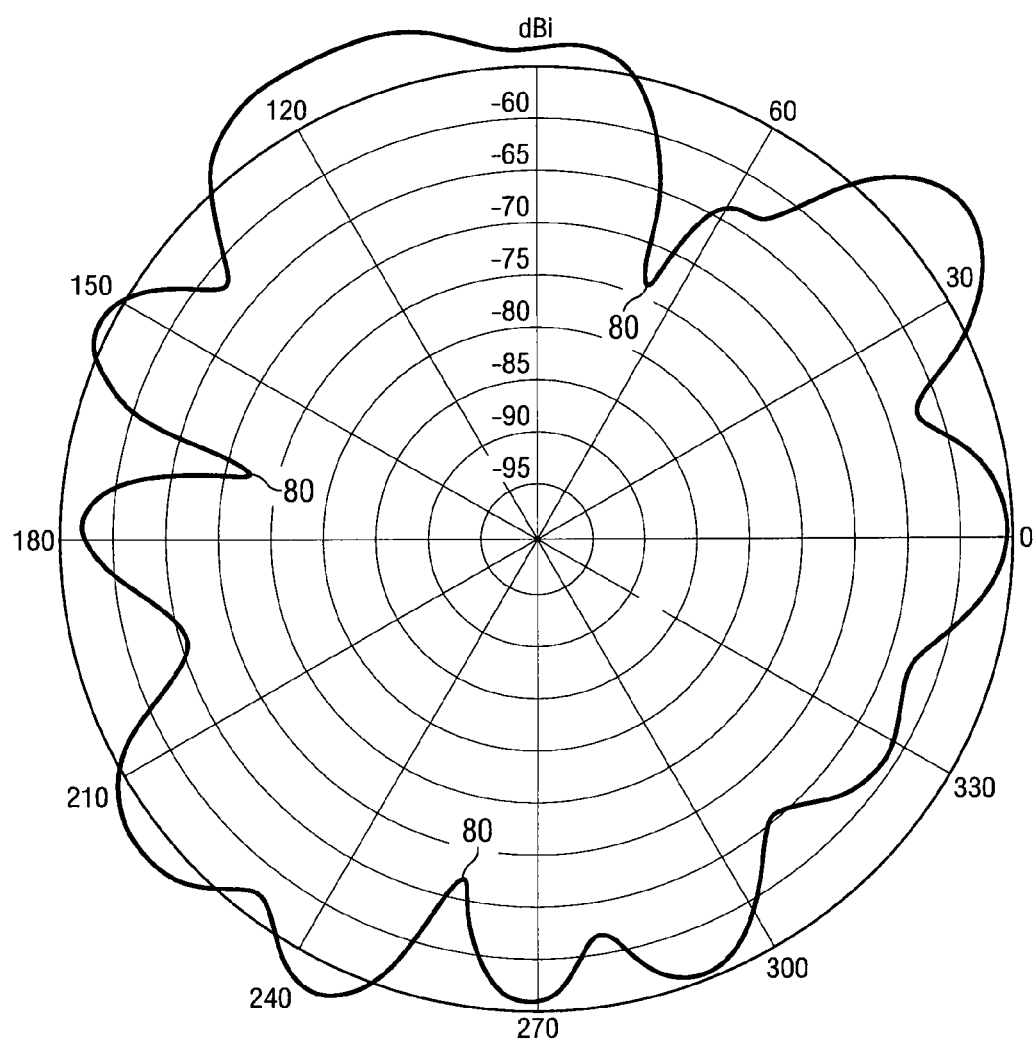
FIG. 6 are experimental results of the horizontal plane radiation pattern of the antenna arrangement of the device shown in FIG. 4 with the transmitter having a horizontally polarized antenna.

With an unbalanced antenna type, the placement of the attached RF cable affects the radiation efficiency of the antenna. In the antenna system of FIG. 2, the length of the RF cable is kept to a minimum, basically running in a substantially linear line along the steering column assembly from the RKE module to the antenna assembly. An alternate arrangement is shown in FIG. 4, where the length of the RF cable is greater than the distance running in a substantially linear line from the RKE module to the antenna assembly. This longer length, creating a slack in the RF cable, changes the antenna radiation pattern. FIGS. 5 and 6 show the antenna directionality pattern for the antenna system arrangements in FIGS. 2 and 4, respectively. An antenna directionality pattern plot describes the relative strength of the radiated field in various directions from the antenna. In FIGS. 5 and 6, the plot is in polar format. Radii are in decibels and angles from the antenna being measured are in degrees. As the positioning of the RF cable within the vehicle and the length of the RF cable change, the antenna directionality pattern changes, and accordingly, the null points 80 occur at different observation angles. These changes of the radiation pattern with RF cable length and positioning are exploited in an antenna diversity system described below.

Figure 7:
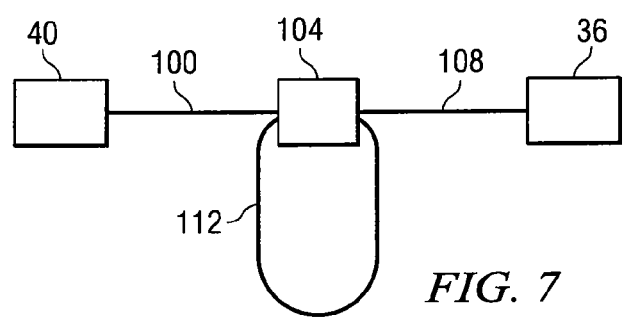
FIG. 7 shows one exemplary embodiment of an antenna diversity system of the present concept.

Turning now to FIG. 7, one exemplary embodiment of an antenna diversity system of the present concept is shown. First RF cable 100 couples antenna assembly 40 to an electronic switch assembly 104. Second RF cable 108 couples electronic switch assembly 104 to remote keyless entry (RKE) module 36. Diversity RF cable 112 is also connected to electronic switch assembly 104.

Figure 8:
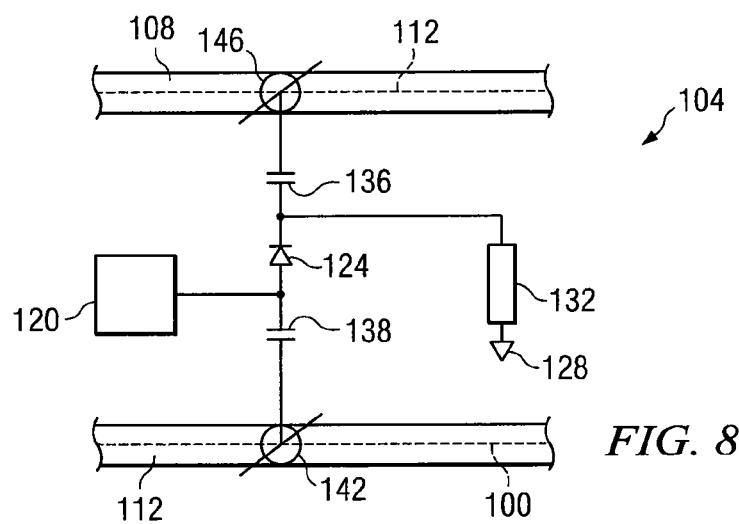
FIG. 8 is a detail view of the electrical RF switch of FIG. 7.

FIG. 8 shows a schematic of the electronic switch assembly 104. Simple astable oscillator 120 is electrically connected to pin diode 124, which is also electrically connected to ground 128 through resistor 132. Capacitors 136 and 138 couple the leads of the pin diode 124 to RF cabling connections 142 and 146, respectively. RF cabling connection 142 connects to first RF cable 100 and also to one end of diversity RF cable 112. RF cabling connection 146 connects to second RF cable 108 and also to the other end of diversity RF cable 112.

With reference to FIGS. 7 and 8, the antenna diversity system switches diversity RF cable 112 into and out of the antenna system. During the time when the output voltage of the astable oscillator is maximum, typically at 5V, first RF cable 100 and second RF cable 108 provide the connection from antenna assembly 40 to RKE module 36. That is, diversity RF cable 112 is not part of the antenna resonant system. However, when the output voltage of the astable oscillator is at minimum, typically 0 v, first RF cable 100, second RF cable 108, and diversity RF cable 112 provide the connection from antenna assembly 40 to RKE module 36. In this case, the diversity RF cable 112 is part of the antenna resonant system.

To accurately receive a signal transmitted from a transmitter, e.g. a Fob key, the time duration in which the oscillator is at maximum and minimum must be at least two times more than the time that is necessary to transmit the activation protocol from the transmitter (Fob key). During transmission, i.e. when the Fob key button is pressed, the activation protocol must be sent at least four times. In this way, it is guaranteed that, for any time delay between transmitting the start of the activation protocol and switching of the diversity RE cable, a full transmission of the activation protocol will be received twice. The first time, the protocol will be received with the antenna system not including the diversity RF cable, and the second time, the protocol will be received with the antenna system including the diversity RF cable. Thereby, the communication between the transmitter and antenna system is improved.

Figure 9:
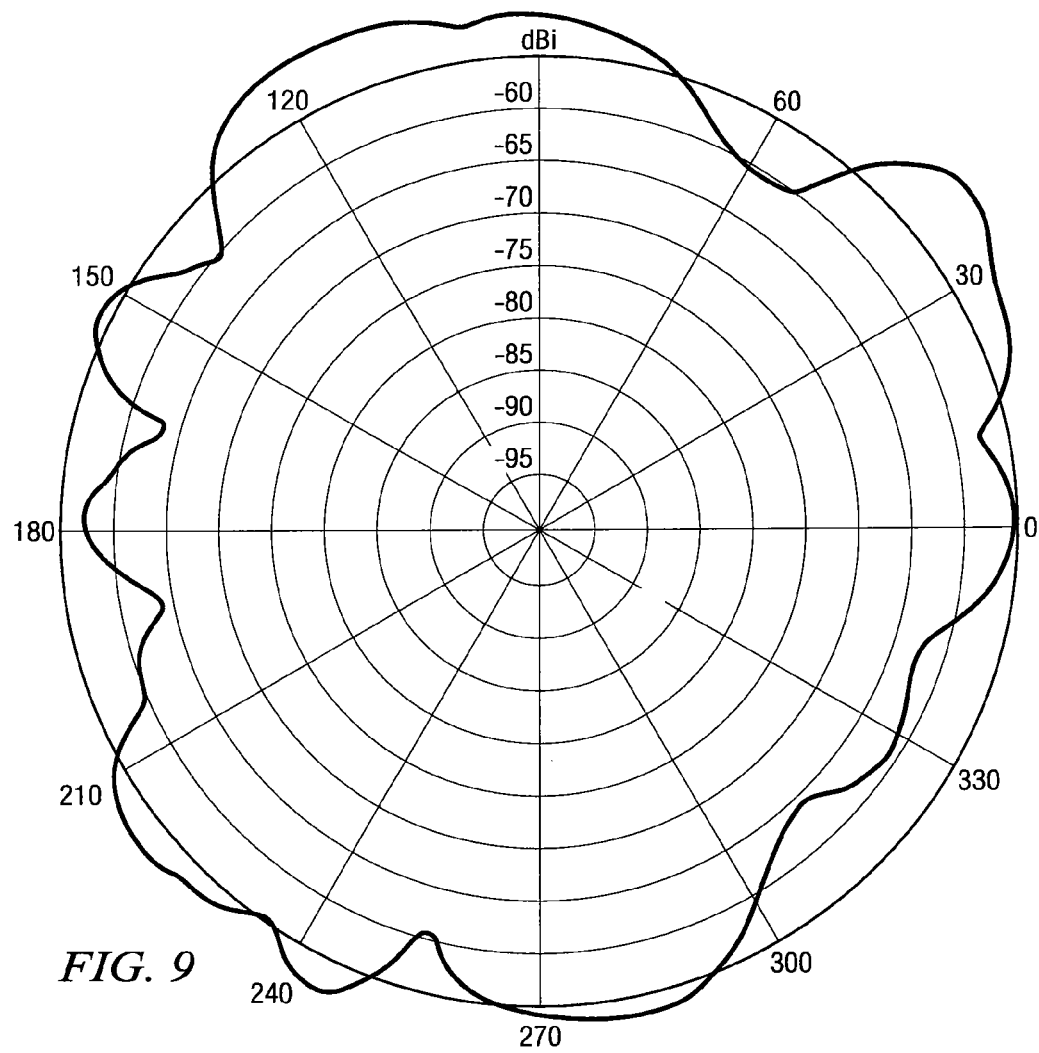
FIG. 9 shows the average antenna radiation pattern of the antenna arrangement of FIG. 11.

Turning now to FIG. 9, shown is the antenna directionality pattern of the above-described diversity antenna system. This diversity antenna directionality pattern is the overlap of the curves in FIGS. 5 and 6. The nulls present in FIGS. 5 and 6 are no longer present in the diversity antenna directionality pattern of FIG. 9. By eliminating these nulls, the antenna directionality pattern is improved. This improvement translates into better communication range for the antenna system, where range is the distance between a transmitter and antenna with a remote control module, which can be activated.

Another way to look at the antenna directionality patterns of FIGS. 5, 6, and 9 is by examining the communication range of the antenna along different azimuth angle directions. Along a direction where a null occurs, the range of the antenna (in meters) will be less than the range of the antenna along a direction where no null occurs. It is known that the range D can be expressed by the following equation: $D"=q*F$ (8), where F(8) is the antenna directionality at the azimuth angle direction 8, q is a coefficient that depends on both the noise level of the system and the operation frequency, and n depends on the environment. For example, n can be chosen equal to approximately 2.0 for free space (e.g., non-urban environment and approximately 3.0 for an urban environment. Assuming that the average directionality value corresponds to the range of 100 m, the curve of FIG. 5 results in 28% of the angle points (over 360 angle degrees) having a range of less than 63 m, 8% of the angle points having a range of less than 40 m, 3% of the angle points having a range of less than 25 m, 1.5% with less than 16 m, and 0.5% with less than 10 m. However, using the same values for the FIG. 9 curve, 12% of the angle points have a range of less than 63 m and no angle points have a range of less than 40 m, 25 m, 16 m, or 10 m. In other words, under the diversity system, the antenna may receive a signal from a source that is greater than 40 m away in all directions, whereas in the non-diversity system, the antenna will not be able to receive a signal at some angles at 40m away from the same source. Thus, the range performances of the antenna diversity system of the present concept are significantly improved.

Figure 10:
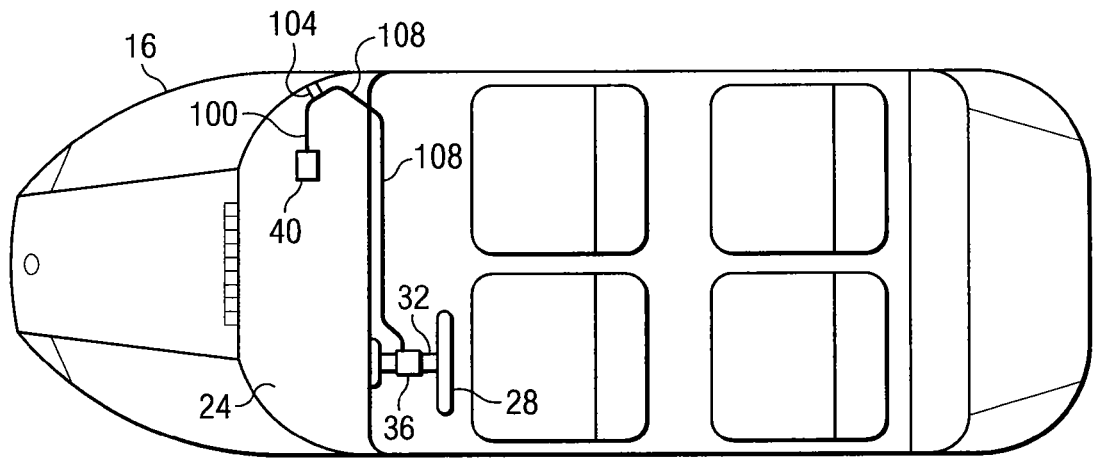
FIG. 10 shows another exemplary embodiment of the present concept.

With reference to FIG. 10, shown is another exemplary embodiment of the present concept. Vehicle has a vehicle integrated front panel 24. A steering wheel 28 is mounted on steering column assembly 32. Remote keyless entry (RKE) module 36 is mounted on top of the steering column assembly 32, and is grounded to the vehicle chassis 16. Antenna assembly 40 is separate from the RKE module 36 and is mounted under the vehicle integrated front panel 24. First RF cable 100 connects an electronic switch assembly 104 to the antenna assembly 40. Electronic switch assembly 104 is grounded to the vehicle chassis 16. Second RF cable 108 connects electronic switch assembly 104 to RKE module 36.

Electronic switch assembly 104 switches the vehicle chassis 16 into and out of the antenna resonant system, providing two different effective RF cable lengths between the circuit board and the vehicle chassis. When switch 104 is open antenna assembly includes the circuit board ground plus the cable part 100 plus cable part 108 plus the vehicle chassis 16. When switch 104 is closed to the vehicle chassis 16, the antenna assembly includes circuit board ground plus cable part 100 plus vehicle chassis 16. So, for two different switch positions we have two different antenna assemblies and therefore two different antenna patterns with dips in different angle directions as seen in FIGS. 5 and 6. These two antenna patterns are combined in the diversity antenna system, which results in the antenna pattern in FIG. 9 which eliminates the nulls.

During the time when the output voltage of the astable oscillator 120 is maximum, typically at 5V, the pin diode 124 of the electronic switching assembly 104 grounds the first RF cable 100 to the vehicle chassis 16. However, when the output voltage of the astable oscillator 120 is at minimum, typically 0 v, first RF cable 100 and second RF cable 108 provide the connection from antenna assembly 40 to RKE module 36. Therefore, during one transmission of the activation protocol, the diversity antenna resonant system is formed of a radio frequency circuit including antenna assembly 40, first RF cable 100, and vehicle chassis 16. During the second transmission of the activation protocol, the diversity antenna resonant system includes antenna assembly 40, first RF cable 100, second RF cable 108, and the vehicle chassis 16.

Figure 11:
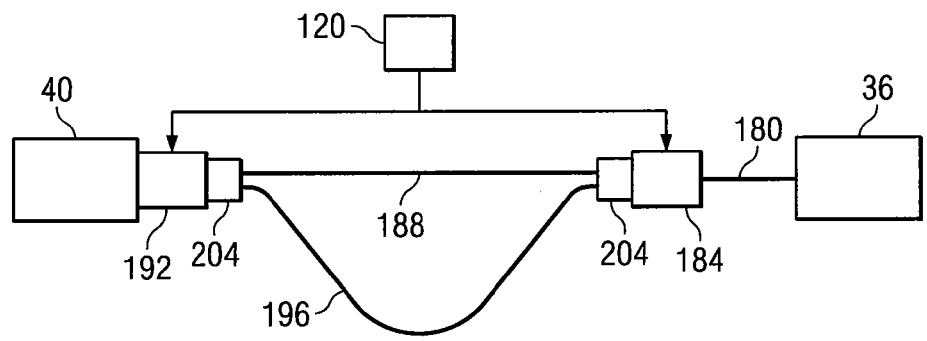
FIG. 11 shows another exemplary embodiment of the present concept.

Turning now to FIG. 11, shown is another embodiment of the present concept. First RF cable 180 connects remote keyless entry (RKE) module 36 to first electronic switch assembly 184. First diversity RF cable 188 connects first electronic switch assembly 184 to an identical second electronic switch assembly 192, such that first RF diversity cable 188 runs in a substantially linear direction from the first electronic switch assembly 184 to the second electronic switch assembly 192. Second electronic switch assembly 192 is coupled to antenna assembly 40. Second diversity RF cable 196 also connects first electronic switch assembly 184 to second electronic switch assembly 192. Second diversity RF cable 196 is of a length that is greater than the substantially linear distance between the first electronic switch assembly 184 and the second electronic switch assembly 192. Synchronization circuit 120 connects to first electronic switch assembly 184 and to second electronic switch assembly 192. Optionally, ferrite beads 204 may be attached to both ends of the first diversity RF cable 188 and the second diversity RF cable 196.

The first and second electronic switch assemblies act to switch between the first diversity RF cable 188 and the second diversity RF cable 196. The different lengths of the first and second diversity RF cables provide the diversity in the antenna directionality pattern. The synchronization circuit 120 which in one embodiment may be a simple astable oscillator, acts to synchronize the operation of the first electronic switch assembly 184 and second electronic switch assembly 192. When the voltage applied to switches 192 and 184 by the synchronization circuit 120 is equal to, for example, approximately 5 volts, the antenna 40 is connected to the RKE module 36 through cable 188, however when voltage is equal to, for example, approximately 0 volts antenna 40 is connected to the RKE module 36 through cable 196. It is to be appreciated that other voltage values may be used, dependant on the particular implementation and use.

Figure 12:
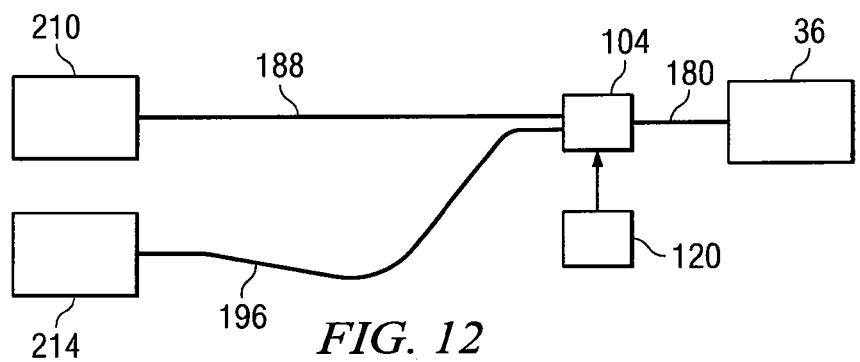
FIG. 12 shows another exemplary embodiment of the present concept.

With reference to FIG. 12, another exemplary embodiment of the present concept is shown. First RF cable 180 couples remote keyless entry (RKE) module 36 to electronic switch assembly 104. Synchronization circuit 120 connects to electronic switch assembly 104. First diversity RF cable 188 couples electronic switch assembly 104 to first antenna assembly 210, such that first diversity RF cable 188 runs in a substantially linear direction from the electronic switch assembly 104 to the first antenna assembly 210. Second diversity RF cable 196 couples electronic switch assembly 104 to second antenna assembly 214. Second diversity RF cable 196 is of a length that is greater than the substantially linear distance between the electronic switch assembly 104 and the first antenna assembly 210.

The electronic switch assembly 104 switches between two antenna resonant systems, one being formed of first antenna assembly 210, the first diversity RF cable 188, and the first RF cable 180, the second being formed of second antenna assembly 214, second diversity RF cable 196, and first RF cable 180. Each antenna resonant system has a different antenna radiation pattern and different antenna gain characteristic. Thus, electronic switch assembly 104, in switching between the two resonant systems, provides antenna diversity reception to the remote keyless entry (RKE) module 36.

Figure 13:
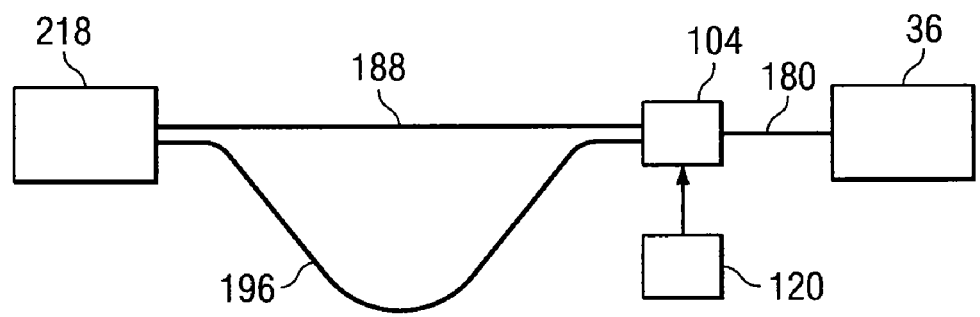
FIG. 13 shows another exemplary embodiment of the present concept.

With reference now to FIG. 13, another exemplary embodiment of the present concept is shown. In this embodiment, rather than using two antenna assemblies, circuitry for two antennas is deposited on the same printed circuit board. Circuitry for two antennas (shown in FIG. 14) is deposited on dual antenna assembly 218. First RF cable 180 couples remote keyless entry (RKE) module 36 to electronic switch assembly 104. Synchronization circuit 120 connects to electronic switch assembly 104. First diversity RF cable 188 couples electronic switch assembly 104 to a first antenna circuitry of dual antenna assembly 218, such that first diversity RF cable 188 runs in a substantially linear direction from the electronic switch assembly 104 to the dual antenna assembly 218. Second diversity RF cable 196 couples electronic switch assembly 104 to second antenna circuitry of dual antenna assembly 218. Second diversity RF cable 196 is of a length that is greater than the substantially linear distance between the electronic switch assembly 104 and the dual antenna assembly 218.

The electronic switch assembly 104 switches between two antenna resonant systems, one being formed of the first antenna circuitry of the dual antenna assembly 218, first diversity RF cable 164, and first RF cable 180, the second being formed of second antenna circuitry of the dual antenna assembly 218, second diversity RF cable 196, and first RF cable 180. Each antenna resonant system has a different antenna radiation pattern and different antenna gain characteristic. Thus, electronic switch assembly 104, in switching between the two resonant systems, provides antenna diversity reception to the remote keyless entry (RKE) module 36.

Figure 14:
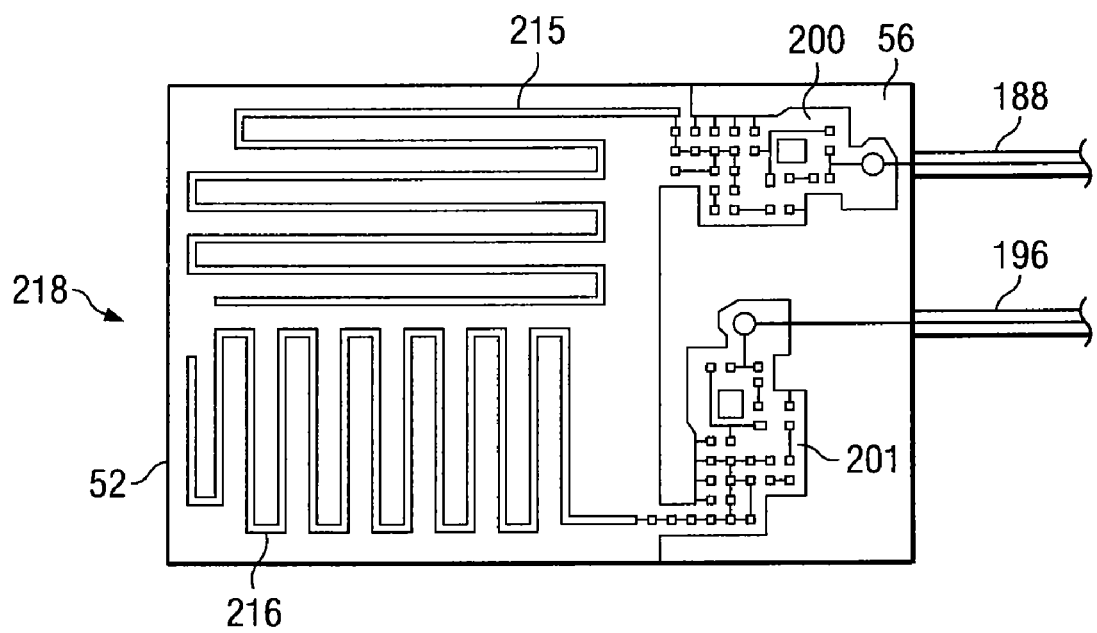
FIG. 14 is a detailed view of the duel antenna assembly shown in FIG. 13.

Turning now to FIG. 14, provided is a more detailed view of the dual antenna assembly shown in FIG. 13 as 218. Antenna assembly 218 includes a first antenna 215 connected to the first diversity RF cable 188 through an antenna matching circuit 200. Antenna assembly 218 includes a second antenna 216 connected to the second diversity RF cable 196 through an antenna matching circuit 201. Ground plane 56 is common for the first antenna and the second antenna. Both antennas are placed on the same circuit board 52.

Figure 15A:
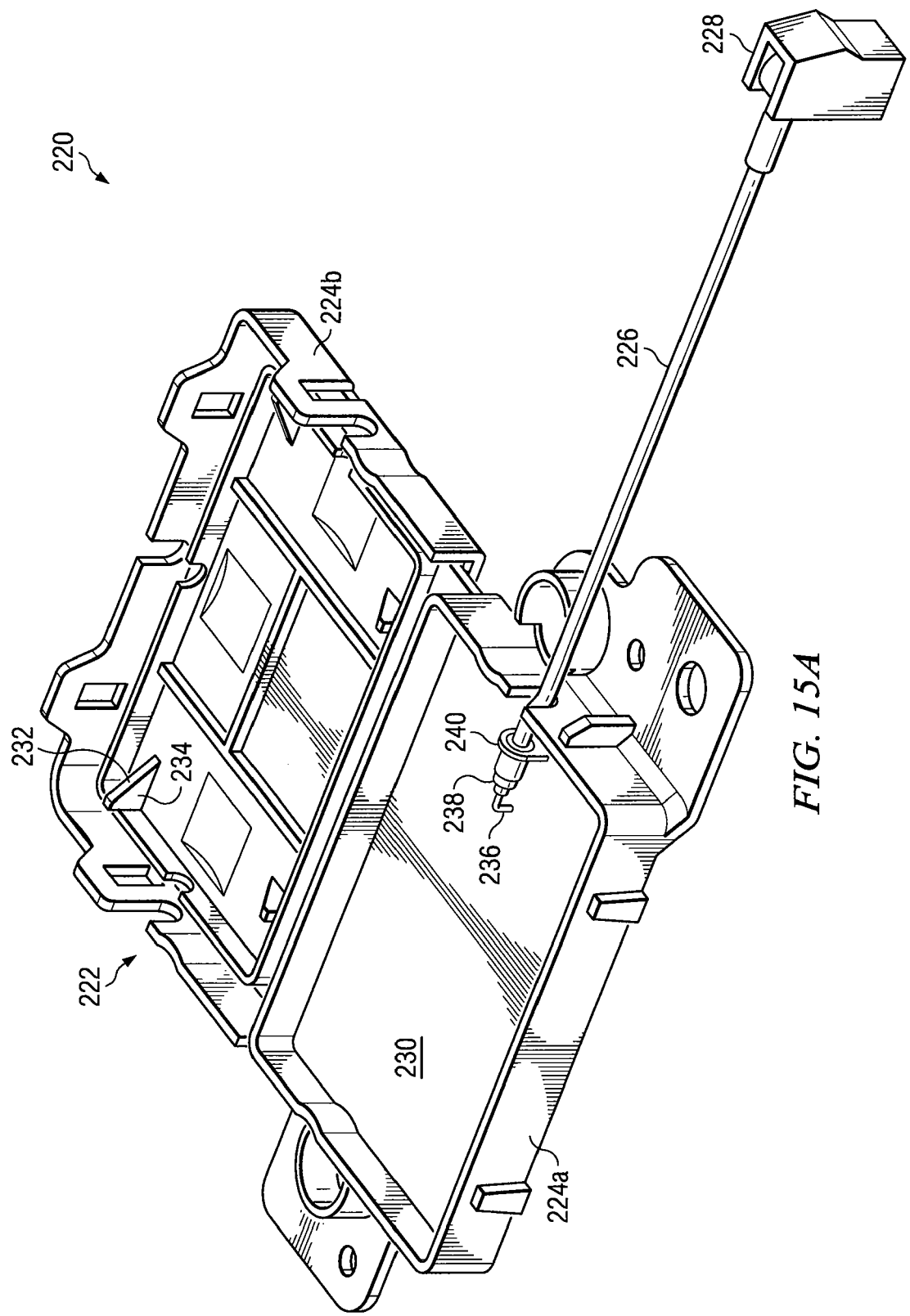
FIGS. 15A-15C are illustrations of an exemplary antenna system 220 that includes an antenna assembly 222 for receiving and communicating signals to an RKE control module in a vehicle.
Figure 15B:
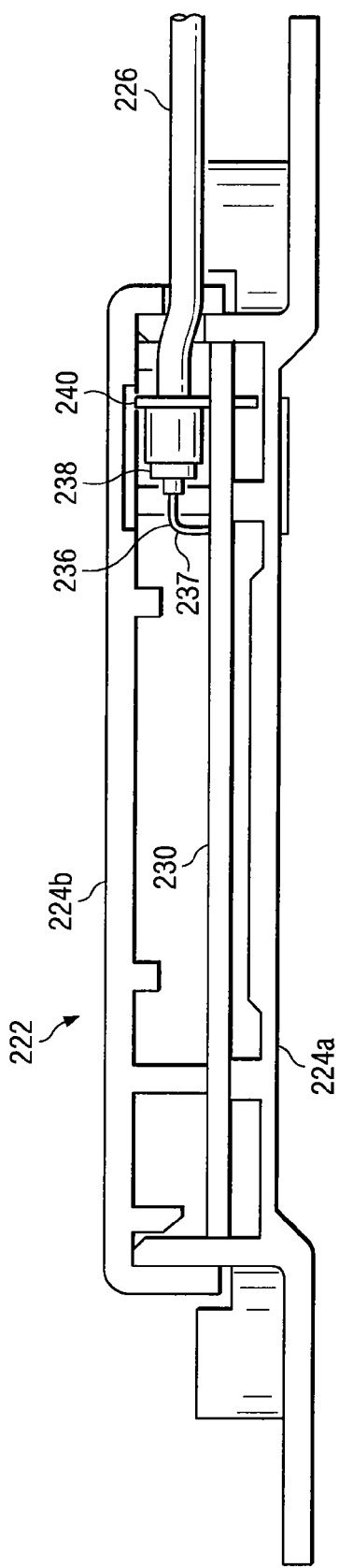
Figure 15C:
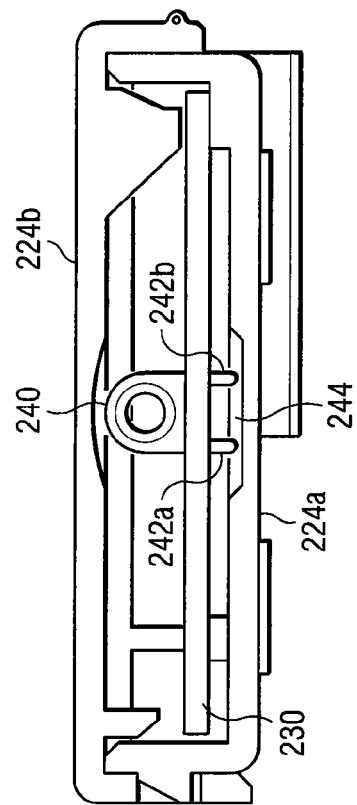

FIGS. 15A-15C are illustrations of an exemplary antenna system 220 that includes an antenna assembly 222 for receiving and communicating signals to an RKE control module in a vehicle. The antenna system 220 includes a housing assembly 222 that has bottom and top assembly portions 224a and 224b (collectively 224). Alternative configurations may also be utilized in accordance with the principles of the present invention. As shown, the bottom and top assembly portions 224 together with a hinge, such as a living hinge, as understood in the art, form a single component housing. A wiring harness 226 extends between the housing assembly 222 and connector 228 for connecting to an RKE control module. In one embodiment, the connector 228 is a Fakra connector. The wiring harness 226 may be between one and three feet long.

A printed circuit board 230, shown without any electronics for exemplary purposes, may be mounted within the housing assembly 222. The printed circuit board 230 may include an antenna, such as antenna assembly 218, printed thereon for receiving RKE signals from a keyfob. In one embodiment, the printed circuit board 230 is mounted in a manner to be positioned in the center of the bottom and top assembly portions 224a and 224b. The bottom and top assembly portions 224 may be configured with standoffs, such as standoff 232, to position the printed circuit board 230. As understood in the art, positioning a printed circuit board, especially an RF circuit board, away from dielectric materials can alter signal operations. Rather than using standoffs, other configurations may be utilized for positioning and securing the printed circuit board 230 between the assembly portions 224. On top of the standoff 232 may be one or more crush ribs 234 to secure the printed circuit board 230 between the bottom and top assembly portions and to minimize vibration and mechanical shock to the printed circuit board 230. In one embodiment, the crush ribs 234 are included on the standoffs 232 on either the bottom or top assembly portions 224a or 224b.

The wiring harness 226 may be a coaxial wiring harness that includes a center conductor 236 and coaxial shield 238. As shown, the center conductor 236 has a 90 degree bend to extend perpendicularly onto the printed circuit board 230. In one embodiment, the center conductor 236 extends through the printed circuit board and is soldered to the bottom, top, or both sides of the printed circuit board 230. FIG. 15B is a side view of the cable harness 226 extending into the housing assembly 222. As shown, the center conductor 236 has a 90 degree bend 237, or substantially close to 90 degrees, for connection to the printed circuit board 230. This 90 degree bend of the center conductor 236 does not affect RF performance. The 90 degree bend configuration minimizes potential for damage to the cable to occur during assembly, especially during soldering operations. It is common for soldering operations of a coaxial cable to cause damage by heating the center conductor, thereby causing the center conductor to melt into the coaxial shield 238. By providing a 90 degree bend, the center conductor can be further isolated and potential damage to the coaxial cable reduced. The 90 degree bend further helps to avoid the situation where condensation within the housing assembly 222 causes a short between the center conductor 236 and coaxial shield 238. Although shown as 90 degrees, it should be understood that other angles and configurations may alternatively be used to prevent the center conductor from melting and causing a short with the coaxial shield 238.

Continuing with FIG. 15A, a coaxial cable terminator 240 may be connected to the coaxial shield 238 and printed circuit board 230 for grounding purposes. In one embodiment, the coaxial cable terminator 240 may be one produced by ITT Canon having part number 055-939-9049AR6. It should be understood that other coaxial cable terminators may be utilized in accordance with the principles of the present invention. It should further be understood that other configurations to connect the coaxial shield 238 to the printed circuit board 230. As shown, the coaxial cable terminator 240 connects to the coaxial shield 238 and extends onto and through the printed circuit board 230. FIG. 15B shows the coaxial cable terminator 240 extending through the printed circuit board 230 to operate to retain the coaxial cable to the printed circuit board 230. In one embodiment, the coaxial cable terminator 240 is connected to the top, bottom, or both of the printed circuit board 230. FIG. 15C shows the coaxial cable terminator 240 having legs 242a and 242b (collectively 242) passing through the printed circuit board 230, but do are prevented from pressing onto a top surface 244 of the bottom assembly portion 224 to minimize vibrations onto the printed circuit board 230.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

We claim:

1. An antenna system for remote control applications comprising:
    a communications module;
    a printed circuit board including an antenna assembly disposed thereon and a ground plane;
    a coaxial cable terminator having a first end and a second end, the first end coupled to the ground plane of the printed circuit board and the second end extending and terminating laterally outwardly from the printed circuit board; and
    a radio frequency cable having a first connection end and a second connection end, the first connection end being coupled to the communications module and the second connection end being coupled to the printed circuit board, the second connection end including a center conductor for communicating signals and a coaxial shield encircling the center conductor and terminating substantially in the second end of the coaxial cable terminator, the center conductor including a portion extending from the coaxial shield and the second end of the coaxial cable terminator and having a substantially 90 degree bend beyond the second end of the coaxial cable terminator, the substantially 90 degree bend extending the portion of the center conductor laterally inwardly for connecting it with the antenna disposed on the printed circuit board.

2. The antenna system of claim 1, wherein the antenna assembly is located a predetermined distance from the communications module, the predetermined distance substantially reducing null regions in an antenna radiation pattern of the antenna system.

3. The antenna system of claim 2, wherein the antenna assembly is attached to a vehicle integrated front panel and wherein the remote keyless entry (RKE) module is attached to a vehicle steering assembly.

4. The antenna system of claim 3, wherein the radio frequency cable runs in a substantially linear direction from the remote keyless entry (RKE) module to the antenna assembly.

5. The antenna system of claim 1, wherein the communications module is a remote keyless entry (RKE) module.

6. The antenna system of claim 5, wherein the antenna assembly further comprises:
    a first antenna arm, deposited on the printed circuit board; and
    a second antenna arm, deposited on the printed circuit board.

7. The antenna system of claim 6, wherein the antenna assembly further comprises a matching circuit deposited on the printed circuit board.

8. The antenna system of claim 6, wherein the antenna assembly further comprises an amplifier circuit deposited on the printed circuit board.

9. The antenna system of claim 1, further comprising a housing in which the printed circuit board is housed and into which the radio frequency cable extends to connect to the printed circuit board.

10. The antenna system of claim 1, wherein the housing includes a bottom portion and top portion and each portion includes at least four standoffs to press against the printed circuit board.

11. The antenna system of claim 10, wherein the standoffs of the top portion include crush ribs for pressing against the printed circuit board.

* * * * *